(12) United States Patent
Kim et al.

(10) Patent No.: US 9,837,639 B2
(45) Date of Patent: Dec. 5, 2017

(54) DISPLAY APPARATUS AND METHOD OF MANUFACTURING THE SAME

(71) Applicant: Samsung Display Co., Ltd., Yongin-Si, Gyeonggi-do (KR)

(72) Inventors: Hyun-Ho Kim, Yongin-Si (KR); Soo-Youn Kim, Yongin-Si (KR); Seung-Yong Song, Yongin-Si (KR); Sang-Hwan Cho, Yongin-Si (KR); Jin-Koo Kang, Yongin-Si (KR); Seung-Hun Kim, Yongin-Si (KR); Cheol Jang, Yongin-Si (KR); Chung-Sock Choi, Yongin-Si (KR); Sang-Hyun Park, Yongin-Si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/454,908

(22) Filed: Mar. 9, 2017

(65) Prior Publication Data

US 2017/0179440 A1 Jun. 22, 2017

Related U.S. Application Data

(62) Division of application No. 14/445,004, filed on Jul. 28, 2014, now Pat. No. 9,608,234.

(30) Foreign Application Priority Data

Feb. 27, 2014 (KR) .................. 10-2014-0023711

(51) Int. Cl.
*H01L 21/00* (2006.01)
*H01L 51/52* (2006.01)
(Continued)

(52) U.S. Cl.
CPC ...... *H01L 51/5284* (2013.01); *H01L 27/3211* (2013.01); *H01L 27/3246* (2013.01);
(Continued)

(58) Field of Classification Search
USPC ............................. 438/28; 257/40
See application file for complete search history.

(56) References Cited

U.S. PATENT DOCUMENTS 8,274,456 B2 9/2012 Hayakawa et al.
9,263,703 B2 2/2016 Kim et al.
(Continued)

FOREIGN PATENT DOCUMENTS

JP 2013-003266 A 1/2013
JP 2013-097187 A 5/2013
(Continued)

OTHER PUBLICATIONS

Abbott et al., Optical and Electrical Properties of Laser Texturing for High-efficiency Solar Cells, Progress in Photovoltaics: Research and Applications, Jan. 5, 2006, pp. 225-235, vol. 14, John Wiley and Sons, Ltd., Australia.
(Continued)

*Primary Examiner* — Telly Green
(74) *Attorney, Agent, or Firm* — Lewis Roca Rothgerber Christie LLP

(57) ABSTRACT

According to one or more embodiments of the present invention, a display apparatus includes: a substrate; a display unit which is formed on the substrate and includes an emission area and a non-emission area; a first coating layer which is formed on the display unit and has an uneven area formed on the emission area; a first blocking layer which is formed on the non-emission area of the first coating layer; and a second blocking layer which is formed on the first blocking layer and prevents reflection of external light.

10 Claims, 10 Drawing Sheets

(51) Int. Cl.
*H01L 51/56* (2006.01)
*H01L 27/32* (2006.01)

(52) U.S. Cl.
CPC .......... *H01L 51/5256* (2013.01); *H01L 51/56* (2013.01); *H01L 2227/323* (2013.01)

(56) References Cited

U.S. PATENT DOCUMENTS

| | | |
|---|---|---|
| 2004/0000540 A1 | 1/2004 | Soboyejo et al. |
| 2004/0239240 A1 | 12/2004 | Kato |
| 2008/0265764 A1 | 10/2008 | Kim et al. |
| 2011/0279441 A1 | 11/2011 | Hayakawa et al. |
| 2013/0069524 A1 | 3/2013 | Takai et al. |
| 2013/0228808 A1 | 9/2013 | Lester |
| 2014/0117330 A1 | 5/2014 | Cho et al. |
| 2015/0123085 A1 | 5/2015 | Kim et al. |

FOREIGN PATENT DOCUMENTS

| | | |
|---|---|---|
| KR | 10-2004-0089532 | 10/2004 |
| KR | 10-2008-0082320 | 9/2008 |
| KR | 10-2011-0041201 A | 4/2011 |
| KR | 10-2012-0092907 A | 8/2012 |
| KR | 10-2012-0138037 A | 12/2012 |
| KR | 10-2013-0045267 | 6/2013 |
| KR | 10-2014-0056498 | 5/2014 |

OTHER PUBLICATIONS

Wang et al., Laser micro structuring on a Si substrate for improving surface hydrophobicity, Journal of Micromechanics and Microengineering, Jul. 15, 2009, 6 Pages, vol. 19, IOP Publishing, Ltd., United Kingdom.

Iyengar et al., Ultralow reflectance metal surfaces by ultrafast laser texturing, Applied Optics, Nov. 1, 2010, pp. 5983-5988, vol. 49, No. 31, Optical Society of America, United States of America.

DISPLAY APPARATUS AND METHOD OF MANUFACTURING THE SAME

CROSS-REFERENCE TO RELATED APPLICATION

This application is a divisional of U.S. patent application Ser. No. 14/445,004, filed Jul. 28, 2014, which claims priority to and the benefit of Korean Patent Application No. 10-2014-0023711, filed on Feb. 27, 2014, in the Korean Intellectual Property Office, the entire contents of both of which are incorporated herein by reference.

BACKGROUND

1. Field

One or more embodiments of the present invention relate to a display apparatus and a method of manufacturing the same.

2. Description of the Related Art

An organic light-emitting display apparatus is a self-emitting display apparatus that displays images by using (utilizing) a plurality of organic light-emitting devices (OLEDs) that emit light. Light is emitted due to energy generated when excitons (which are formed from electrons and holes that are combined inside an intermediate layer) drop from an excited state to a ground state. The organic light-emitting display apparatus displays an image by using (utilizing) the generated light.

However, when the organic light-emitting display apparatus is used (utilized) in a bright place (e.g., a place with bright lighting), the organic light-emitting display apparatus may have problems such that the expression (or viewing) of a black image is difficult, and the contrast thereof is low due to reflection of light from the outside.

SUMMARY

Aspects according to one or more embodiments of the present invention are directed toward a display apparatus and a method of manufacturing the same.

Additional aspects will be set forth in part in the description which follows and, in part, will be apparent from the description, or may be learned by practice of the presented embodiments.

According to one or more embodiments of the present invention, a display apparatus includes: a substrate; a display unit on the substrate, the display unit includes an emission area and a non-emission area; a first coating layer on the display unit, the first coating layer has an uneven area on the emission area; a first blocking layer on the non-emission area; and a second blocking layer on the first blocking layer, the second blocking layer configured to prevent reflection of external light.

The first blocking layer may include a black matrix.

The first coating layer may include a waterborne binder.

The second blocking layer may include one or more dielectric layers alternately stacked with one or more metal layers.

The second blocking layer may sequentially include a first dielectric layer, a first metal layer, and a second dielectric layer from an upper part (upper surface) of the display unit.

The second blocking layer may further sequentially include a second metal layer and a third dielectric layer from an upper part of the second dielectric layer.

The display unit may include a pixel-defining layer having an opening, and the emission area may be formed by the opening.

The display apparatus may further include an encapsulation layer on the display unit.

The display apparatus may further include a second coating layer on the first coating layer, the second coating layer has a greater refractive index than the first coating layer.

The display unit may include an organic light-emitting device (OLED) on the substrate.

According to one or more embodiments of the present invention, a method of manufacturing a display apparatus includes: forming a display unit including an emission area and a non-emission area on a substrate; forming a first coating layer on the display unit; forming a mask on the non-emission area; forming an uneven area on the first coating layer; removing the mask from the non-emission area; forming a first blocking layer on the non-emission area; and forming a second blocking layer on the first blocking layer.

The uneven area may be formed by using (utilizing) laser beams.

The uneven area may be formed by using (utilizing) chemical materials.

The first coating layer may include a waterborne binder.

The first blocking layer may include a black matrix.

The second blocking layer may be formed by alternately stacking one or more dielectric layers and one or more metal layers.

The display unit may include a pixel-defining layer having an opening, and the emission area may be formed by the opening.

The method may further include forming an encapsulation layer on the display unit.

The method may further include forming a second coating layer, which has a greater refractive index than the first coating layer, on the first coating layer.

The display unit may include an organic light-emitting device (OLED) on the substrate.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
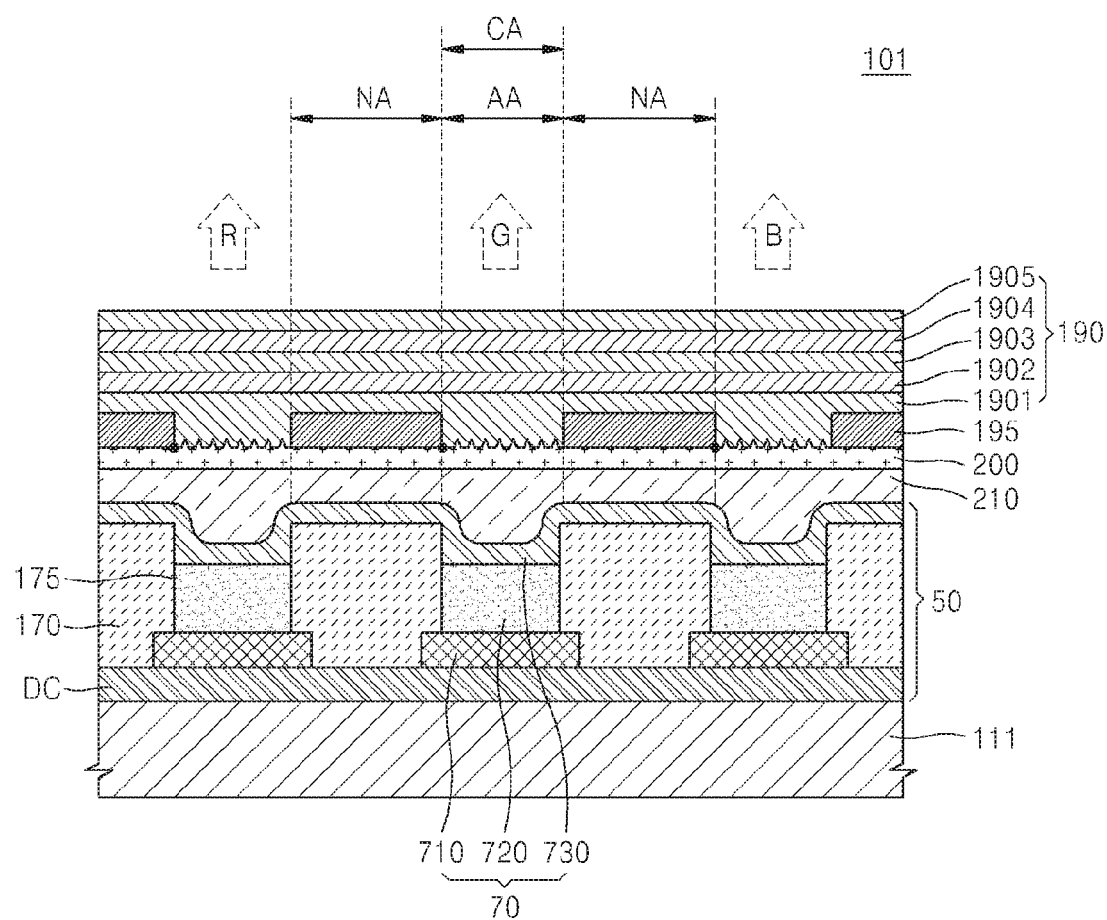
FIG. 1 is a partial cross-sectional view of a display apparatus according to an embodiment of the present invention.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. Expressions such as "at least one of," when preceding a list of elements, modify the entire list of elements and do not modify the individual elements of the list. Further, the use of "may" when describing embodiments of the present invention refers to "one or more embodiments of the present invention."

Hereinafter, the present invention will be described in more detail by explaining example embodiments of the invention with reference to the attached drawings. Like reference numerals in the drawings denote like elements, and thus their description will not be repeated for each of the drawings.

While terms such as "first", "second", etc., may be used to describe various components, such components must not be limited to the above terms. The above terms are used only to distinguish one component from another.

As used herein, the singular forms "a", "an", and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

Hereinafter, the present invention will be described in more detail by explaining example embodiments of the invention with reference to the attached drawings.

FIG. 1 is a partial cross-sectional view of a display apparatus 101 according to an embodiment of the present invention.

As shown in FIG. 1, the display apparatus 101 may include a substrate 111, a display unit 50, a first coating layer 200, a first blocking layer 195, and a second blocking layer 190. The display unit 50 may include an organic light-emitting device (OLED) 70 and a driving circuit unit DC.

The substrate 111 may be an insulating substrate that is formed of glass, quartz, ceramic, etc., or may be a flexible substrate formed of plastic. Also, the substrate 111 may be a metallic substrate formed of stainless steel.

The driving circuit unit DC is formed on the substrate 111. The driving circuit unit DC includes thin film transistors (TFTs) 10 and 20 (refer to FIG. 2), a capacitor 80 (refer to FIG. 2), etc., and drives the OLED 70. That is, the OLED 70 emits light and displays an image according to driving signals transmitted by the driving circuit unit DC.

Figure 2:
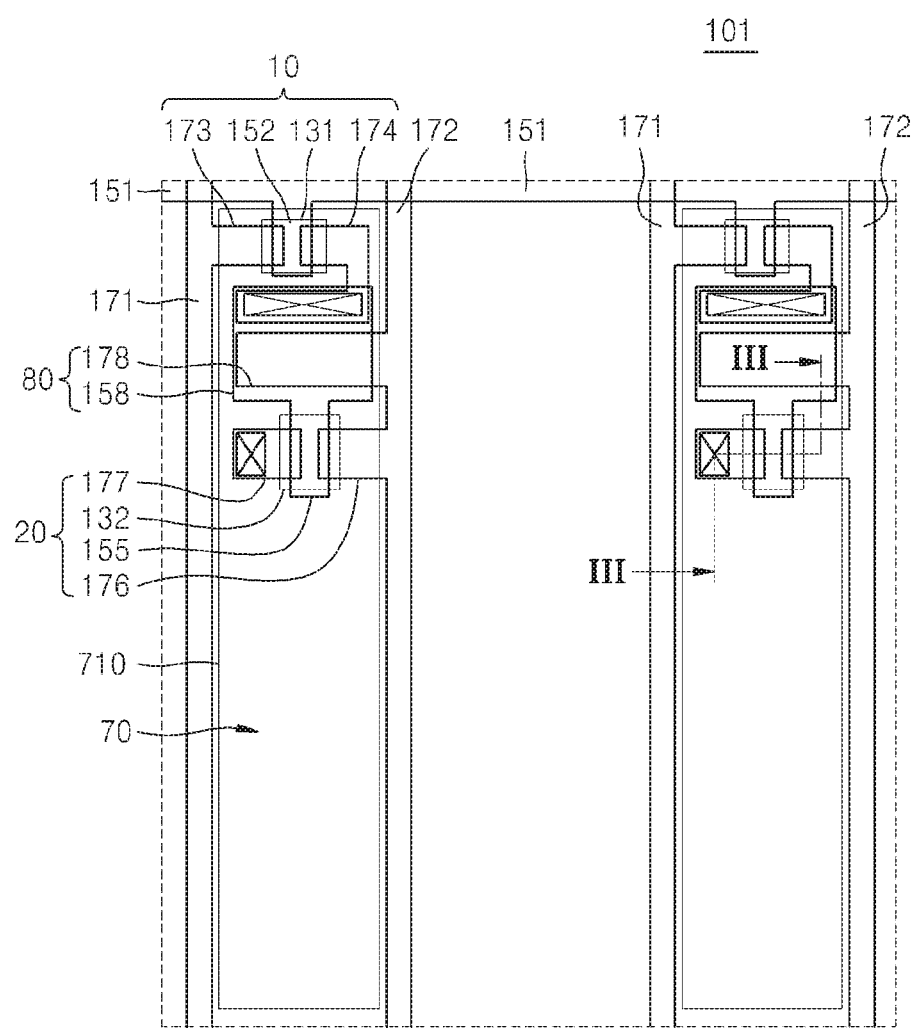
FIG. 2 is a view of a pixel circuit of the display apparatus of FIG. 1.
Figure 3:
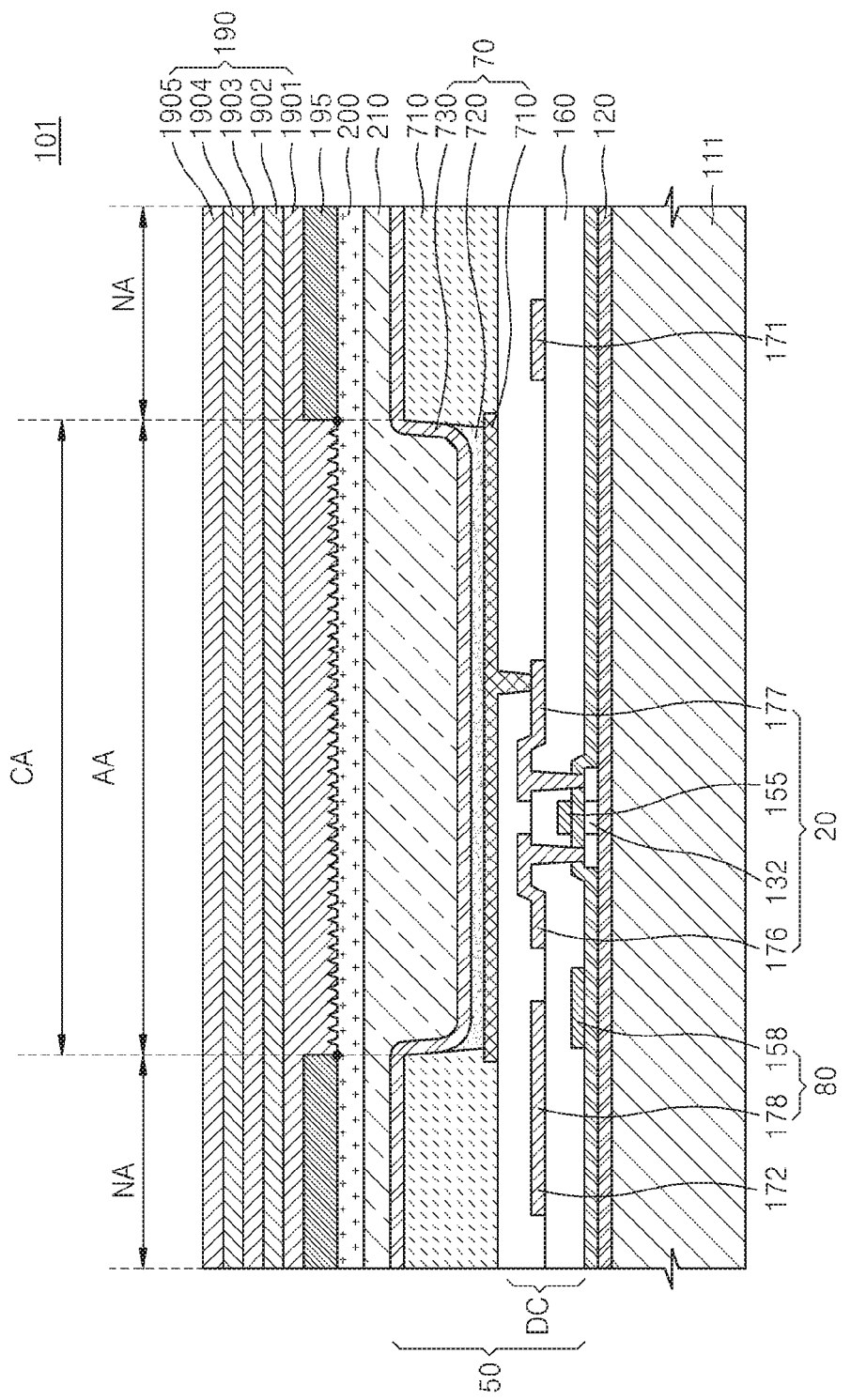
FIG. 3 is a cross-sectional view taken along the line III-III' of FIG. 2.

A detailed structure of the driving circuit unit DC is shown in FIGS. 2 and 3, but a structure of the driving circuit unit DC is not limited thereto. The driving circuit unit DC may have a variety of structures within the scope of the invention.

The OLED 70 includes a first electrode 710, an intermediate layer 720, and a second electrode 730. The first electrode 710 is an anode electrode that is a hole injection electrode, and the second electrode 730 is a cathode electrode that is an electron injection electrode. However, the present invention is not limited thereto. That is, the first electrode 710 may be a cathode electrode, and the second electrode 730 may be an anode electrode.

The intermediate layer 720 includes an emission layer. As another example, the intermediate layer 720 includes an emission layer, and may further include at least one of a hole injection layer (HIL), a hole transport layer (HTL), an electron transport layer (ETL), and an electron injection layer (EIL). However, the present invention is not limited thereto. As another example, the intermediate layer 720 includes an emission layer, and may further include other functional layers.

The display apparatus 101 may further include pixel-defining layers (or a pixel-defining layer) 170 having openings 175 which expose a portion of the first electrode 710. The intermediate layer 720 may emit light in the openings 175 included in the pixel-defining layers 170. That is, each opening 175 included in each pixel-defining layer 170 may define an emission area AA in which the light is actually emitted. An area where the opening 175 of the pixel-defining layer 170 is formed may be the emission area AA (that is, the emission area AA may be formed by the opening 175). An area where the pixel-defining layer 170 is formed, that is, the rest of areas excluding the emission area AA, may be a non-emission area NA.

An encapsulation layer 210 is arranged to face the substrate 111 and covers the OLED 70 and the driving circuit unit DC. The encapsulation layer 210 may include a plurality of inorganic layers or may include both organic and inorganic layers.

The organic layer included in the encapsulation layer 210 may be formed of polymers, and may be a single layer or a laminated layer formed of at least one of polyethyleneterephthalate, polyimide, polycarbonate, epoxy, polyethylene, and polyacrylate. Alternatively, the organic layer may be formed of polyacrylate, and for example, may include a polymerized monomer composition including a diacrylate-based monomer, and a triacrylate-based monomer. The monomer composition may further include a monoacrylate-based monomer. Also, the monomer composition may further include, but is not limited to, a photoinitiator such as thrombopoietin (TPO).

The inorganic layer included in the encapsulation layer 210 may be a single layer or a laminated layer including a metal oxide and/or a metal nitride. For example, the inorganic layer may include at least one of silicon nitride ($SiN_x$), aluminum oxide ($Al_2O_3$), silicon dioxide ($SiO_2$), and titanium oxide ($TiO_2$).

An uppermost layer, which is exposed to the outside from among layers forming the encapsulation layer 210, may be formed of an inorganic layer in order to prevent moisture from penetrating into the OLED 70.

The encapsulation layer 210 may have at least one sandwich structure in which at least one organic layer is disposed between at least two inorganic layers. As another example, the encapsulation layer 210 may have at least one sandwich structure in which at least one inorganic layer is disposed between at least two organic layers. As another example, the encapsulation layer 210 may have both a sandwich structure in which at least one organic layer is disposed between at least two inorganic layers, and a sandwich structure in which at least one inorganic layer is disposed between at least two organic layers.

The encapsulation layer 210 may sequentially include a first inorganic layer, a first organic layer, and a second inorganic layer from an upper part (upper surface) of the OLED 70.

As another example, the encapsulation layer 210 may sequentially include the first inorganic layer, the first organic layer, the second inorganic layer (as above), a second organic layer, and a third inorganic layer from the upper part of the OLED 70.

As another example, the encapsulation layer 210 may sequentially include the first inorganic layer, the first organic layer, the second inorganic layer, the second organic layer, the third inorganic layer (as above), a third organic layer, and a fourth inorganic layer from the upper part of the OLED 70.

A halogenated metal layer including lithium fluoride (LiF) may be further disposed between the OLED 70 and the first inorganic layer. The halogenated metal layer may prevent or reduce damage of the OLED 70 when the first inorganic layer is formed by sputtering or plasma deposition.

The first organic layer may have a smaller area than the second inorganic layer, and the second organic layer may have a smaller area than the third inorganic layer.

As another example, the first organic layer may be formed to be fully covered with (or by) the second inorganic layer, and the second organic layer may be formed to be fully covered with (or by) the third inorganic layer.

The first coating layer 200 may be formed on the display unit 50. The first coating layer 200 may be formed on the encapsulation layer 210. An uneven area CA may be formed on the first coating layer 200. The uneven area CA may be formed on the emission area AA. Accordingly, due to a characteristic of an uneven structure, reflection of light from the outside to the OLED 70 is decreased, and thus, visibility (of a displayed image) may be improved.

A surface of the first coating layer 200 may be formed of a material that is phobic to (or repels) the first blocking layer 195 by irradiating laser to the surface. When a black matrix is used (utilized) as the first blocking layer 195, a waterborne binder may be used (utilized) as the first coating layer 200. In this regard, the first coating layer 200 may include $Al_2O_3$, SiNx, or silicon carbon nitride (SiCN). Due to the laser irradiation, the uneven area CA is formed on the surface of the first coating layer 200, and the surface of the first coating layer 200 may become phobic to the first blocking layer 195 at the same time. On the first coating layer 200, surfaces of areas excluding the uneven area CA may be philic to (or attracts) the first blocking layer 195.

The first blocking layer 195 may be formed on the first coating layer 200. The first blocking layer 195 may be formed on the non-emission area NA. The first blocking layer 195 may be formed of a black matrix. As the first blocking layer 195 is patterned (e.g., formed only on the non-emission area NA), transmittance of the emission area AA remains the same, and external light reflection of the non-emission area NA is dramatically reduced, thereby improving the image visibility (relative to if no such first blocking layer 195 were formed).

The first blocking area 195 may be formed on the areas except the uneven area CA. Due to the laser irradiation, the uneven area CA is formed on the surface of the first coating layer 200, and at the same time, the surface of the first coating layer 200 may become phobic to the first blocking layer 195. The other areas on the surface of the first coating layer 200 except the uneven area CA, that is, the non-emission area NA, may have (e.g, only have) a surface which is philic to the first blocking layer 195. Therefore, the first blocking layer 195 may be selectively patterned in the non-emission area NA without using (utilizing) a complicated patterning method using (utilizing) photolithography.

The second blocking layer 190 may be formed on the first blocking layer 195. The second blocking layer 190 may cover the first blocking layer 195. The second blocking layer 190 may be formed by alternately stacking one or more dielectric layers and one or more metal layers therein.

The second blocking layer 190 may sequentially include a first dielectric layer 1901, a first metal layer 1902, a second dielectric layer 1903, a second metal layer 1904, and a third dielectric layer 1905 from an upper part of the display unit 50. As the second blocking layer 190 is formed of a multi-layer thin film structure in which the dielectric layers and the metal layers are alternately stacked, a thickness of the second blocking layer 190 is reduced in comparison with that of a polarizer, and by using (utilizing) destructive interference of light, the external light reflection may be prevented or reduced.

Hereinafter, an internal structure of the display apparatus 101 will be described in more detail with reference to FIGS. 2 and 3. FIG. 2 is a structural view of pixels, and FIG. 3 is a cross-sectional view taken along the line III-III' of FIG. 2. Hereinafter, the term "pixel" refers to a minimum (the smallest) unit used (utilized) when the display apparatus 101 displays an image.

One pixel (e.g., one unit of pixel) includes a plurality of subpixels, and the plurality of subpixels may emit light of various colors. For example, the subpixels may include subpixels which emit red light, green light, and blue light, respectively; or may include subpixels which emit red light, green light, blue light, and white light, respectively.

The subpixels may include intermediate layers 720 including emission layers which emit light of various colors, respectively. For example, the subpixels may include the intermediate layers 720 including the emission layers which emit red light, green light, and blue light, respectively.

As another example, the subpixels which emit light of various colors include the intermediate layers 720 which emit light of the same color, for example, white light, and may also include color-converting layers or color filters which convert the white light into light of other color.

The intermediate layers 720 which emit the white light may have various structures, for example, may include a structure in which at least an emission material emitting red light, an emission material emitting green light, and an emission material emitting blue light are stacked.

As another example with regard to emission of the white light, the intermediate layers 720 may include a structure in which at least an emission material emitting red light, an emission material emitting green light, and an emission material emitting blue light are mixed.

The red light, the green light, and the blue light are examples, and the present embodiment is not limited thereto. That is, if the intermediate layers 720 are able to emit white light, a combination of various colors may be used (utilized) as well, other than a combination of the red light, the green light, and the blue light.

In FIGS. 2 and 3, an active matrix (AM) display apparatus 101 having a 2Tr-1 Cap structure in which one pixel has two thin film transistors (TFTs) 10 and 20 and a capacitor 80 is illustrated, but the present invention is not limited thereto. Therefore, the display apparatus 101 may be formed to have various structures such as a structure in which one pixel has more than three TFTs and at least two capacitors, and a structure in which lines are additionally formed. In the specification, a pixel denotes a minimum unit used (utilized) when an image is displayed, and the pixels are arranged in each pixel area. The display apparatus 101 displays an image by using (utilizing) the pixels.

As illustrated in FIGS. 2 and 3, the display apparatus 101 includes a switching TFT 10, a driving TFT 20, a capacitor 80, and the OLED 70, which are respectively formed in each of the pixels. A structure including the switching TFT 10, the driving TFT 20, and the capacitor 80 is referred to as the driving circuit unit DC. The display apparatus 101 further includes gate lines 151 (which are arranged along a certain direction), data lines 171 (which are insulated from and are arranged to cross the gate lines 151), and common power lines 172.

One pixel may be defined by a boundary formed by each of the gate lines 151, the data lines 171 and the common power lines 172, but is not limited thereto.

As described above, the OLED 70 includes the first electrode 710, the intermediate layer 720 formed on the first electrode 710, and the second electrode 730 formed on the intermediate layer 720. Holes and electrons are injected into the intermediate layer 720 from the first and second electrodes 710 and 730, respectively. Light is emitted when excitons formed from a combination of the injected holes and electrons drop from an excited state to a ground state.

The capacitor 80 includes condenser plates 158 and 178 that are arranged by interposing an interlayer insulating layer 160 therebetween. The interlayer insulating layer 160 is a dielectric substance. Charges stored in the capacitor 80 and a voltage between the condenser plates 158 and 178 determine the capacitance of the capacitor 80.

The switching TFT 10 includes a switching semiconductor layer 131, a switching gate electrode 152, a switching source electrode 173, and a switching drain electrode 174. The driving TFT 20 includes a driving semiconductor layer 132, a driving gate electrode 155, a driving source electrode 176, and a driving drain electrode 177. The switching semiconductor layer 131 and the driving semiconductor layer 132 may be formed to contain (include) various materials. For example, the switching semiconductor layer 131 and the driving semiconductor layer 132 may contain inorganic semiconductor materials such as amorphous silicon or crystalline silicon. As another example, the switching semiconductor layer 131 and the driving semiconductor layer 132 may include an oxide semiconductor. As another example, the switching semiconductor layer 131 and the driving semiconductor layer 132 may contain organic semiconductor materials.

The switching TFT 10 is used (utilized) for selecting pixels to be used (utilized) by the display apparatus 101. The switching gate electrode 152 is connected to the gate lines 151. The switching source electrode 173 is connected to the data lines 171. The switching drain electrode 174 is arranged to be separated from the switching source electrode 173, and is connected to the condenser plate 158.

The driving TFT 20 applies a driving voltage to the first electrode 710 in order for the intermediate layer 720 of the OLED 70 in the selected pixel to emit light. The driving gate electrode 155 is connected to the condenser plate 158 (connected to the switching drain electrode 174). The driving source electrode 176 and the condenser plate 178 are respectively connected to the common power lines 172. The driving drain electrode 177 is connected to the first electrode 710 of the OLED 70 through a contact hole.

The switching TFT 10 operates when a gate voltage is applied to the gate lines 151, and transmits a data voltage (which is applied to the data lines 171) to the driving TFT 20. A voltage, which corresponds to a voltage gap between a common voltage (which is applied from the common power lines 172 to the driving TFT 20) and a data voltage (transmitted by the switching TFT 10) is stored in the capacitor 80. A current corresponding to the voltage stored in the capacitor 80 flows into the OLED 70 through the driving TFT 20, and thus the OLED 70 emits light.

A buffer layer 120 may be formed on the substrate 111.

A case where the display unit 50 includes the OLED 70 has been described, but the present invention is not limited thereto. That is, the present invention may be applied to a display apparatus including various kinds of display units, for example, a display unit having a liquid crystal device.

Figure 4:
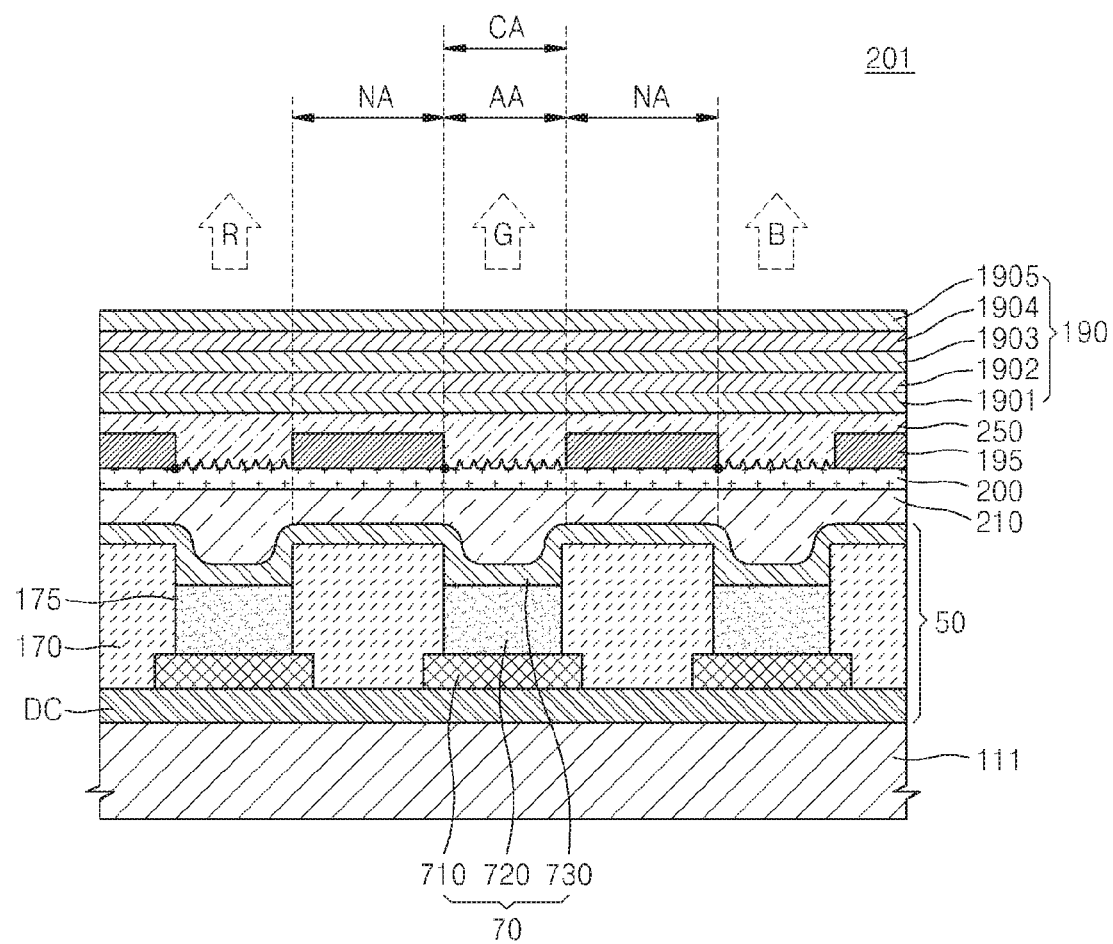
FIG. 4 is a partial cross-sectional view of a display apparatus according to another embodiment of the present invention.

FIG. 4 is a partial cross-sectional view of a display apparatus 201 according to another embodiment of the present invention.

Hereinafter, descriptions will be based on the difference between the apparatuses 101 and 201. Like reference numerals refer to like elements throughout.

Referring to FIG. 4, the display apparatus 201 according to the present embodiment may include a substrate 111, a display unit 50, a first coating layer 200, a first blocking layer 195, a second coating layer 250, and a second blocking layer 190.

The second coating layer 250 may be formed on the first coating layer 200. The second coating layer 250 may cover the first blocking layer 195. A refractive index of the second coating layer 250 may be greater than that of the first coating layer 200. Accordingly, light emitted from inside of the display apparatus 201 is less reflected at an interface and more such light is transmitted to the outside, thereby improving the efficiency of the OLED 70.

FIGS. 5A through 5F are schematic cross-sectional views for explaining a method of manufacturing the display apparatus 101 of FIG. 1.

Figure 5A:
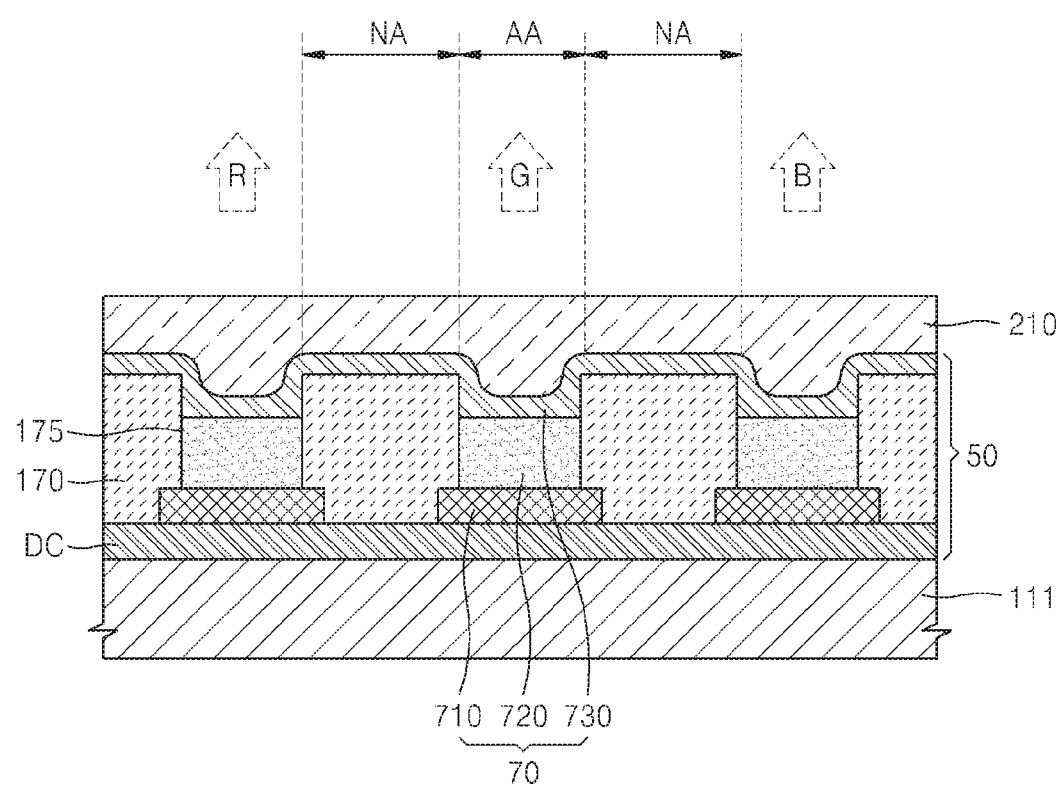
FIGS. 5A through 5F are schematic cross-sectional views for explaining a method of manufacturing the display apparatus of FIG. 1.

As shown in FIG. 5A, the display apparatus (display unit) 50 including the emission area AA and the non-emission area NA is formed on the substrate 111. The encapsulation layer 210 is formed on the display unit 50.

Figure 5B:
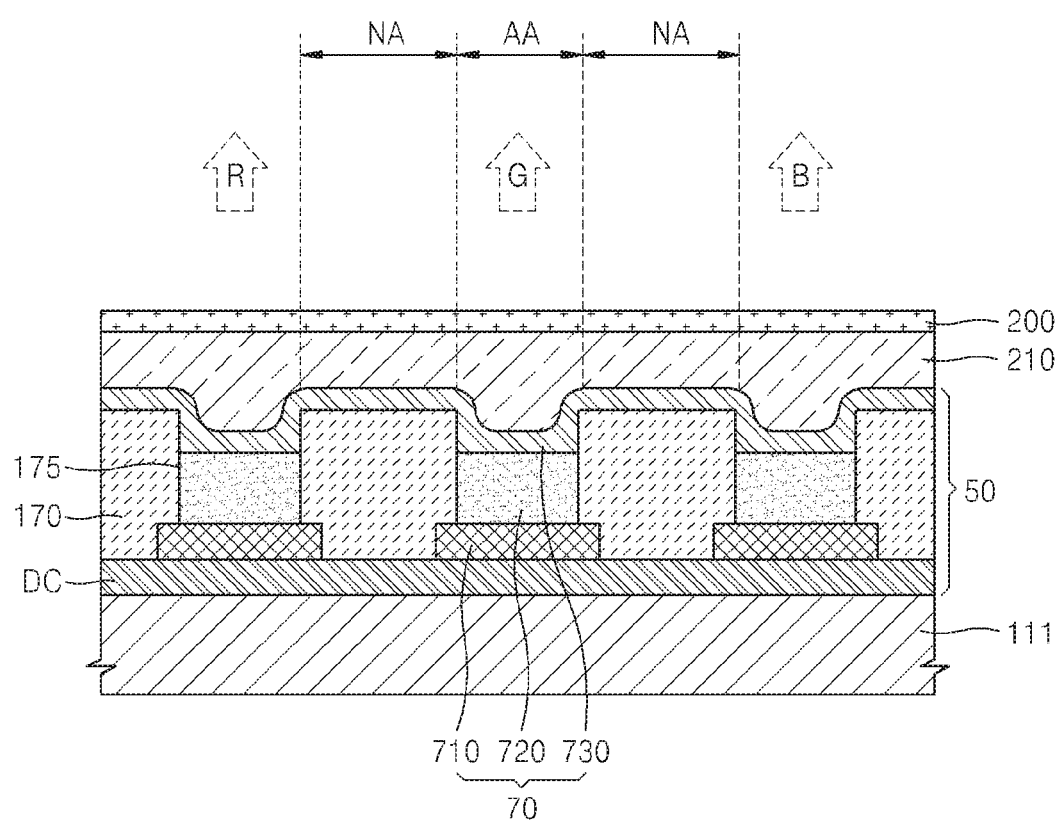

As shown in FIG. 5B, the first coating layer 200 is formed on the encapsulation layer 210 and may fully cover the encapsulation layer 210.

Figure 5C:
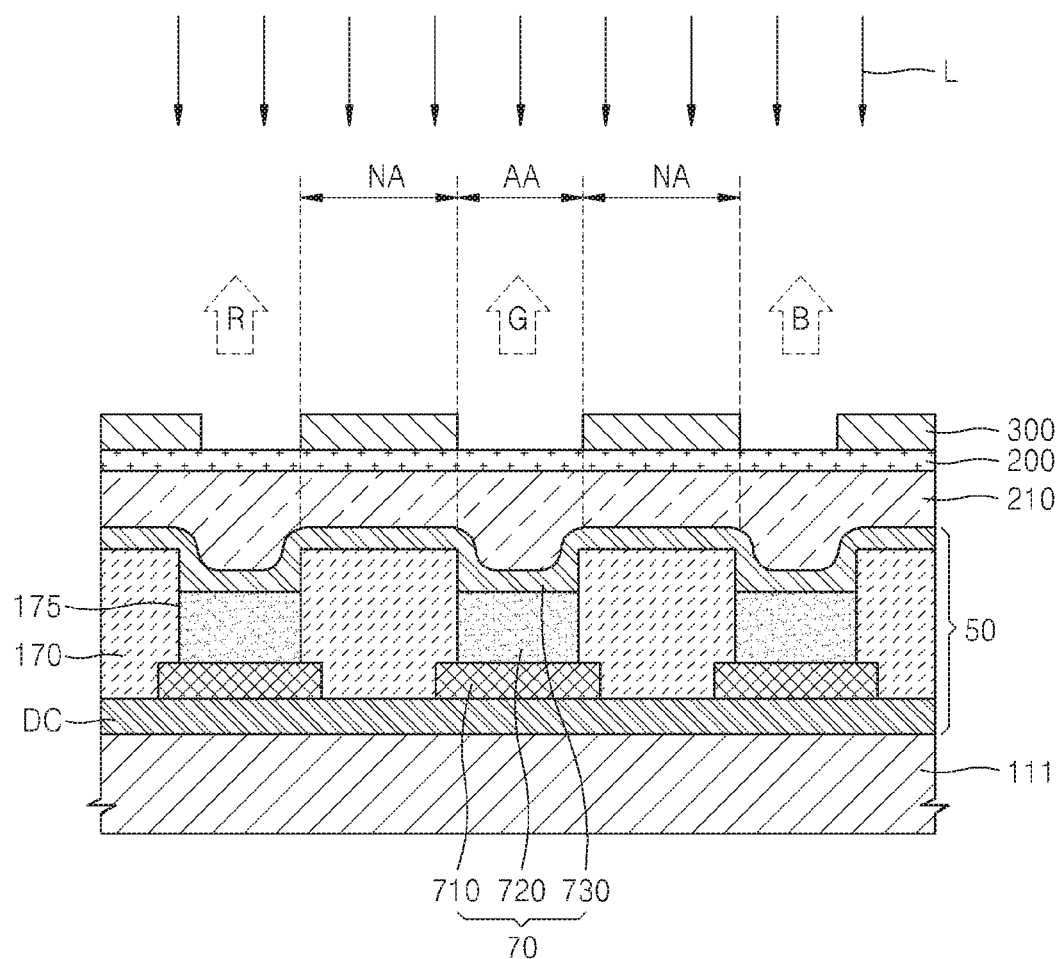

As shown in FIG. 5C, a mask 300 is formed on the non-emission area NA of the first coating layer 200, and then laser beams L are irradiated onto the first coating layer 200. A method of irradiating the laser beams L is described in FIG. 5C, but other suitable methods, such as a method of adding chemical materials on the first coating layer 200, may be used (utilized) as well.

Figure 5D:
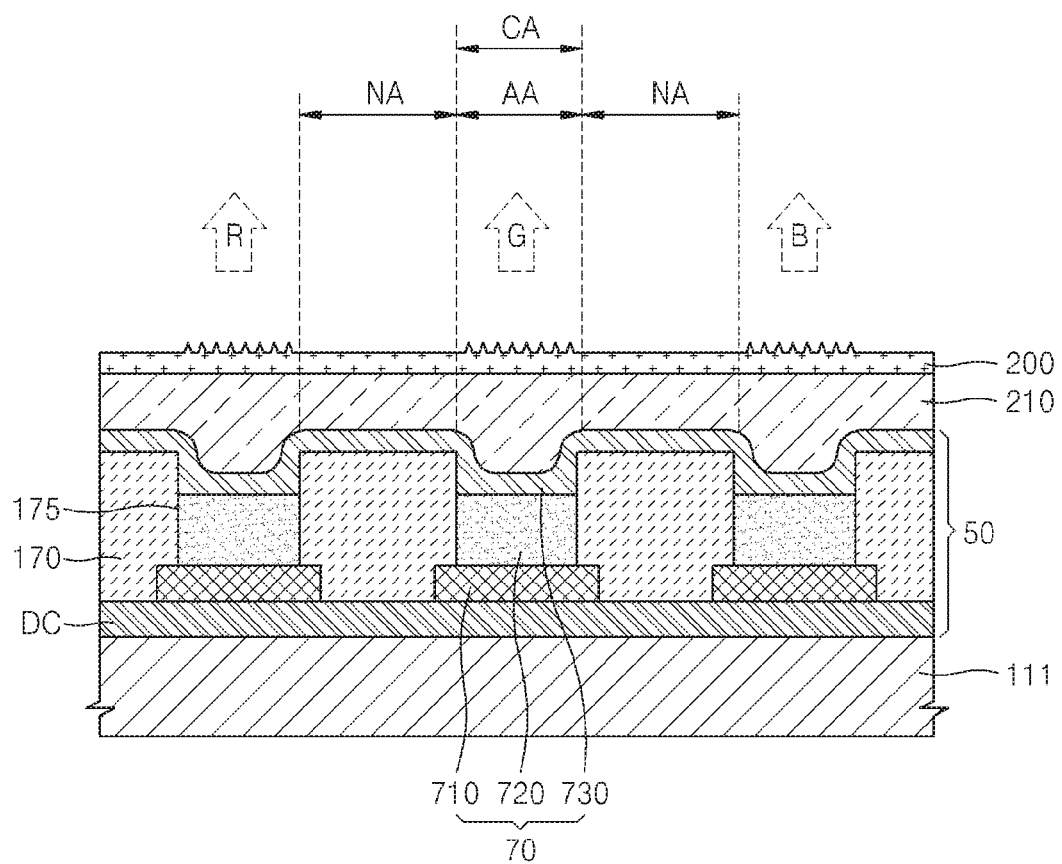

As shown in FIG. 5D, the mask 300 is removed from the non-emission area NA of the first coating layer 200. The uneven area CA is formed on the first coating layer 200 by the laser beams L on an area where the mask 300 is not formed, that is, on the emission area AA. Also, due to use (usage) of the laser beams L, a surface of the uneven area CA formed on the first coating layer 200 may become phobic to the first blocking layer 195 of FIG. 1, and surfaces of the other areas excluding the uneven area CA, that is, the surfaces of the non-emission area NA, may remain philic to the first blocking layer 195 of FIG. 1. The first coating layer 200 may be formed of a waterborne binder.

Figure 5E:
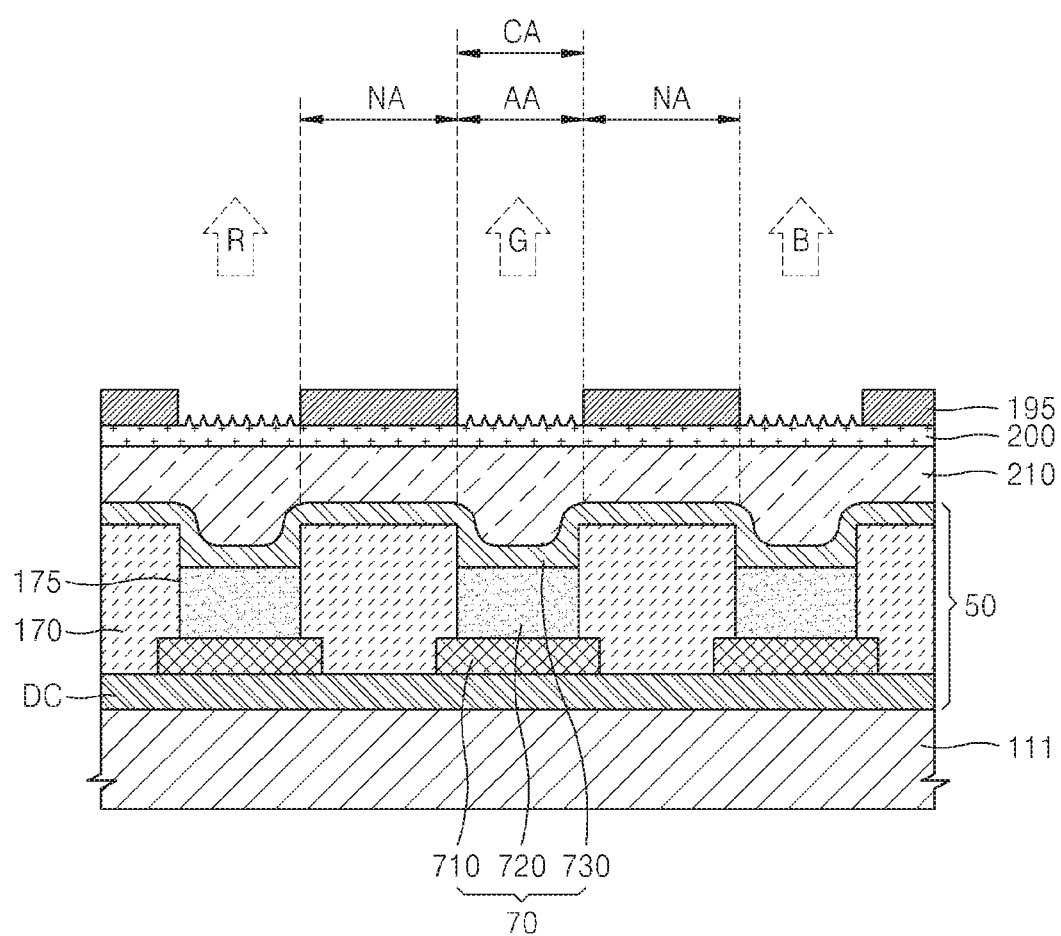

As shown in FIG. 5E, the first blocking layer 195 is formed on areas that are not the uneven area CA on the first coating layer 200, that is, on the non-emission area NA. The emission area AA on the first coating layer 200 is phobic to the first blocking layer 195, and the non-emission area NA on the first coating layer 200 is philic to the first blocking layer 195. Thus, the first blocking layer 195 may be easily patterned on the non-emission area NA. Through the above-described manufacturing procedure, the first blocking layer 195 may be patterned without using (utilizing) photolithography, and thus, the manufacturing procedure is simplified and damage to the emission materials, which may occur when photolithography is employed, may be prevented or reduced. The first blocking layer 195 may include the black matrix.

Figure 5F:
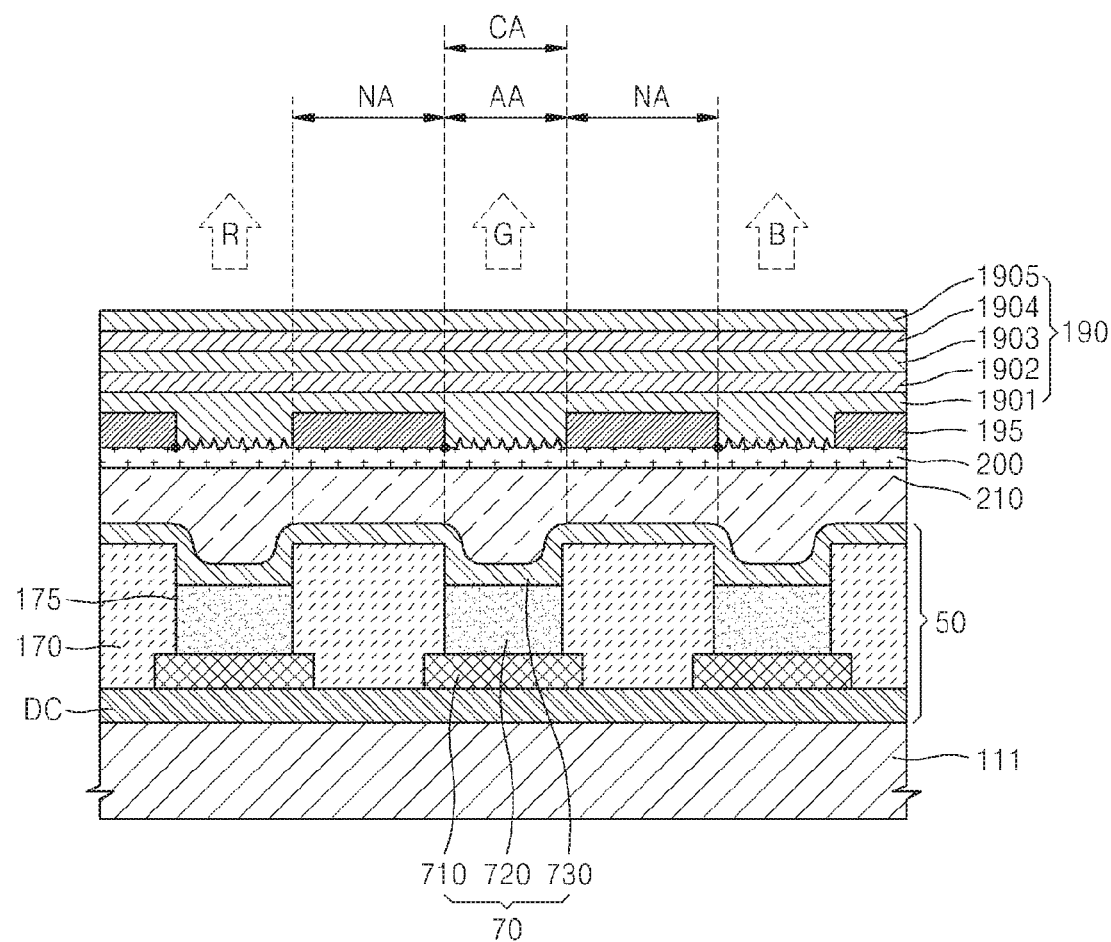

As shown in FIG. 5F, the second blocking layer 190 is formed on the first blocking layer 195. The second blocking layer 190 may be formed by alternately stacking one or more dielectric layers and one or more metal layers therein. The second blocking layer 190 may sequentially include the first dielectric layer 1901, the first metal layer 1902, the second dielectric layer 1903, the second metal layer 1904, and the third dielectric layer 1905 from the upper part of the display unit 50.

Although not illustrated, after the first blocking layer 195 is formed, and prior to the second blocking layer 190 is formed, the second coating layer 250 may be formed on the first coating layer 200, thus completing the manufacture of the display apparatus 201 illustrated in FIG. 4. In this case, the refractive index of the second coating layer 250 is greater than that of the first coating layer 200.

As another example, although not illustrated, after laser beams L are irradiated onto an entire surface of the first coating layer 200, the display apparatus 101 of FIG. 1, which has the uneven area CA that is only formed on the emission area AA, may be manufactured by forming the mask 300 on the emission area AA and re-coating materials of the first coating layer 200 on the non-emission area NA.

As described above, according to the one or more of the above embodiments of the present invention, a display apparatus may reduce external light reflection, and thus visibility of the display apparatus may be improved.

It should be understood that the example embodiments described herein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims, and equivalents thereof.

What is claimed is:

1. A method of manufacturing a display apparatus, the method comprising:
    forming a display unit comprising an emission area and a non-emission area on a substrate;
    forming a first coating layer on the display unit;
    forming a mask on the non-emission area;
    forming an uneven area on the first coating layer;
    removing the mask from the non-emission area;
    forming a first blocking layer on the non-emission area; and
    forming a second blocking layer on the first blocking layer.

2. The method of claim 1, wherein the uneven area is formed by utilizing laser beams.

3. The method of claim 1, wherein the uneven area is formed by utilizing chemical materials.

4. The method of claim 1, wherein the first coating layer comprises a waterborne binder.

5. The method of claim 1, wherein the first blocking layer comprises a black matrix.

6. The method of claim 1, wherein the second blocking layer is formed by alternately stacking one or more dielectric layers and one or more metal layers.

7. The method of claim 1, wherein the display unit comprises a pixel-defining layer having an opening, and
    wherein the emission area is formed by the opening.

8. The method of claim 1, further comprising forming an encapsulation layer on the display unit.

9. The method of claim 1, further comprising forming a second coating layer having a greater refractive index than the first coating layer on the first coating layer.

10. The method of claim 1, wherein the display unit comprises an organic light-emitting device (OLED) on the substrate.

* * * * *